United States Patent
Currie et al.

(10) Patent No.: US 7,138,649 B2
(45) Date of Patent: Nov. 21, 2006

(54) DUAL-CHANNEL CMOS TRANSISTORS WITH DIFFERENTIALLY STRAINED CHANNELS

(75) Inventors: Matthew T. Currie, Windham, NH (US); Anthony J. Lochtefeld, Somerville, MA (US); Eugene A. Fitzgerald, Windham, NH (US)

(73) Assignee: AmberWave Systems Corporation, Salem, NH (US)

( * ) Notice: Subject to any disclaimer, the term of this patent is extended or adjusted under 35 U.S.C. 154(b) by 0 days.

(21) Appl. No.: 10/164,665

(22) Filed: Jun. 7, 2002

(65) Prior Publication Data

US 2003/0227013 A1     Dec. 11, 2003

Related U.S. Application Data

(60) Provisional application No. 60/311,188, filed on Aug. 9, 2001.

(51) Int. Cl.
| | |
|---|---|
| H01L 29/06 | (2006.01) |
| H01L 31/0328 | (2006.01) |
| H01L 31/0336 | (2006.01) |
| H01L 31/072 | (2006.01) |
| H01L 31/109 | (2006.01) |

(52) U.S. Cl. .................. 257/19; 257/18; 257/190; 257/191; 257/192

(58) Field of Classification Search .......... 257/616, 257/190–192, 183, 18–19, 12, 66, 351
See application file for complete search history.

(56) References Cited

U.S. PATENT DOCUMENTS

| | | | |
|---|---|---|---|
| 4,710,788 A | 12/1987 | Däambkes et al. | |
| 4,920,076 A | 4/1990 | Holland et al. | |
| 4,990,979 A | 2/1991 | Otto | |
| 5,241,197 A | 8/1993 | Murakami et al. | |
| 5,291,439 A | 3/1994 | Kauffmann et al. | |
| 5,312,766 A | 5/1994 | Aronowitz et al. | |
| 5,327,375 A | 7/1994 | Harari | |
| 5,442,205 A | 8/1995 | Brasen et al. | |
| 5,461,243 A * | 10/1995 | Ek ..................... | 257/190 |
| 5,523,592 A | 6/1996 | Nakagawa et al. | |
| 5,534,713 A | 7/1996 | Ismail et al. | |
| 5,596,527 A | 1/1997 | Tomioka et al. | |
| 5,617,351 A | 4/1997 | Bertin et al. | |
| 5,683,934 A | 11/1997 | Candelaria | |
| 5,739,567 A | 4/1998 | Wong | |
| 5,777,347 A | 7/1998 | Bartelink | |
| 5,780,922 A | 7/1998 | Mishra et al. | |
| 5,786,612 A | 7/1998 | Otani et al. | |

(Continued)

FOREIGN PATENT DOCUMENTS

DE       41 01 167 A1      7/1992

(Continued)

OTHER PUBLICATIONS

Stanley Wolf and Richard Tauber, "Silicon Processing for the VLSI Era, vol. 1: Process Technology," Lattice Press, Sunset Beach, CA (1986), p. 201.*

(Continued)

*Primary Examiner*—Douglas W. Owens
*Assistant Examiner*—Samuel A Gebremariam
(74) *Attorney, Agent, or Firm*—Goodwin Procter LLP

(57) ABSTRACT

A semiconductor structure having a substrate with a surface layer including strained silicon. The surface layer has a first region with a first thickness less than a second thickness of a second region. A gate dielectric layer is disposed over a portion of at least the first surface layer region.

21 Claims, 10 Drawing Sheets

U.S. PATENT DOCUMENTS

| | | | |
|---|---|---|---|
| 5,792,679 | A | 8/1998 | Nakato |
| 5,808,344 | A | 9/1998 | Ismail et al. |
| 5,847,419 | A | 12/1998 | Imai et al. |
| 5,891,769 | A | 4/1999 | Liaw et al. |
| 5,906,951 | A | 5/1999 | Chu et al. |
| 5,951,757 | A | 9/1999 | Dubbelday et al. |
| 5,963,817 | A | 10/1999 | Chu et al. |
| 5,986,287 | A | 11/1999 | Eberl et al. |
| 5,998,807 | A * | 12/1999 | Lustig et al. ............... 257/66 |
| 6,013,134 | A | 1/2000 | Chu et al. |
| 6,058,044 | A | 5/2000 | Sugiura et al. |
| 6,059,895 | A | 5/2000 | Chu et al. |
| 6,096,590 | A | 8/2000 | Chan et al. |
| 6,107,653 | A | 8/2000 | Fitzgerald |
| 6,111,267 | A | 8/2000 | Fischer et al. |
| 6,117,750 | A | 9/2000 | Bensahel et al. |
| 6,130,453 | A | 10/2000 | Mei et al. |
| 6,143,636 | A | 11/2000 | Forbes et al. |
| 6,204,529 | B1 | 3/2001 | Lung et al. |
| 6,207,977 | B1 | 3/2001 | Augusto |
| 6,249,022 | B1 | 6/2001 | Lin et al. |
| 6,251,755 | B1 | 6/2001 | Furukawa et al. |
| 6,266,278 | B1 | 7/2001 | Harari et al. |
| 6,339,232 | B1 * | 1/2002 | Takagi ..................... 257/192 |
| 6,350,993 | B1 | 2/2002 | Chu et al. |
| 6,399,970 | B1 | 6/2002 | Kubo et al. |
| 6,461,945 | B1 | 10/2002 | Yu |
| 6,498,359 | B1 | 12/2002 | Schmidt et al. |
| 6,555,839 | B1 | 4/2003 | Fitzgerald |
| 6,583,437 | B1 | 6/2003 | Mizuno et al. |
| 6,593,191 | B1 | 7/2003 | Fitzgerald |
| 6,593,641 | B1 * | 7/2003 | Fitzergald ................. 257/616 |
| 6,600,170 | B1 * | 7/2003 | Xiang ...................... 257/18 |
| 6,649,480 | B1 | 11/2003 | Fitzgerald et al. |
| 2001/0003364 | A1 | 6/2001 | Sugawara et al. |
| 2002/0100942 | A1 | 8/2002 | Fitzgerald et al. |
| 2002/0125471 | A1 | 9/2002 | Fitzgerald et al. |
| 2002/0125497 | A1 | 9/2002 | Fitzgerald |
| 2002/0140031 | A1 | 10/2002 | Rim |
| 2003/0052334 | A1 | 3/2003 | Lee et al. |

FOREIGN PATENT DOCUMENTS

| | | |
|---|---|---|
| EP | 0 683 522 A2 | 11/1995 |
| EP | 0 829 908 A2 | 3/1998 |
| EP | 0 838 858 A2 | 4/1998 |
| EP | 0 844 651 A1 | 5/1998 |
| EP | 1 020 900 A2 | 7/2000 |
| JP | 63122176 | 5/1988 |
| JP | 4-307974 | 10/1992 |
| JP | 7-106446 | 4/1995 |
| JP | 11-233744 | 8/1999 |
| JP | 2001319935 | 5/2000 |
| JP | 2001-160594 | 6/2001 |
| JP | 02241195 | 8/2002 |
| WO | WO 98/59365 | 12/1998 |
| WO | WO 99/53539 | 10/1999 |
| WO | WO 00/54338 | 9/2000 |
| WO | WO 01/54202 A1 | 7/2001 |
| WO | WO 01/93338 A1 | 12/2001 |
| WO | WO 01/99169 A2 | 12/2001 |
| WO | WO 02/13262 A2 | 2/2002 |
| WO | WO 02/47168 A2 | 6/2002 |
| WO | WO 02/071488 A1 | 9/2002 |
| WO | WO 02/071491 A1 | 9/2002 |
| WO | WO 02/071495 A1 | 9/2002 |

OTHER PUBLICATIONS

"2 Bit/Cell EEPROM Cell Using Band-to-Band Tunneling for Data Read-Out," *IBM Technical Disclosure Bulletin*, vol. 35, No. 4B (Sep. 1992) pp. 136-140.

Wesler et al., "NMOS and PMOS Transistors Fabricated in Strained Silicon/Relaxed Silicon-Germanium Structures," Electron Devices Meeting, 1992. *Technical Digest* (Dec. 13, 1992) pp. 31.7.1-31.7.3.

Welser et al., "Evidence of Real-Space Hot-Electron Transfer in High Mobility, Strained-Si Multilayer MOSFETs," Electron Devices meetings, 1993. *Technical Digest* (Dec. 1993) pp. 21.3.1-21.3.4.

Armstrong et al., "Design of Si/SiGe Heterojunction Complementary Metal-Oxide-Semiconductor Transistors," *IEDM Technical Digest* (1995) pp. 761-764.

König et al., "SiGe HBTs and HFETs," *Solid-State Electronics*, vol. 38, No. 9 (1995) pp. 1595-1602.

Welser, "The Application of Strained Silicon/Relaxed Silicon Germanium Heterostructures to Metal-Oxide- Semiconductor Field-Effect Transistors," Ph.D. Thesis, Stanford University (1995) p. 1-205.

Sadek et al., "Design of Si/SiGe Heterojunction Complementary Metal-Oxide-Semiconductor Transistors," *IEEE Transactions on Electron Devices*, vol. 43, No. 8 (Aug. 1996) pp. 1224-1232.

Nayak et al., "High Mobility Strained-Si PMOSFET's," *IEEE Transactions on Electron Devices*, vol. 43, No. 10 (Oct. 1996) pp. 1709-1716.

Schäffler, "High-mobility Si and Ge structures," *Semicond. Sci. Technol.*, vol. 12 (1997) pp. 1515-1549.

Usami et al., "Spectroscopic study of Si-based quantum wells with neighboring confinement structure," *Semicon. Sci. Technol.* (1997) (abstract).

König et al., "Design Rules for n-Type SiGe Hetero FETs," *Solid State Electronics*, vol. 41, No. 10 (1997), pp. 1541-1547.

Höck et al., "Carrier mobilities in modulation doped $Si_{1-x}Ge_x$ heterostructures with respect to FET applications," *Thin Solid Films*, vol. 336 (1998) pp. 141-144.

Maiti et al., "Strained-Si heterostructure field effect transistors," *Semicond. Sic. Technol.*, vol. 13 (1998) pp. 1225-1246.

Hackbarth et al., "Strain relieved SiGe buffers for Si-based heterostructure field-effect transistors," *Journal of Crystal Growth*, vol. 201 (1999) pp. 734-738.

O'Neill et al., "SiGe Virtual substrate N-channel heterojunction MOSFETS," *Semicond. Sci. Technol.*, vol. 14 (1999) pp. 784-789.

Parker et al., "SiGe heterostructure CMOS circuits and applications," *Solid State Electronics*, vol. 43, No. 8, (Aug. 1999) pp. 1497-1506.

Rim, "Application of Silicon Based Heterostrucutres to Enhanced Mobility Metal-Oxide-Semiconductor Field-Effect Transistors," Ph.D. Thesis, Stanford University (1999) pp. 1-184.

Xie, "SiGe Field effect transistors," *Materials Science and Engineering*, vol. 25 (1999) pp. 89-121.

Hackbarth et al., "Alternatives to thick MBE-grown relaxed SiGe buffers," *Thin Solid Films*, vol. 369, No. 1-2 (2000) pp. 148-151.

Herzog et al., "SiGe-based FETs: buffer issues and device results," *Thin Solid Films*, vol. 380 (2000) pp. 36-41.

Mizuno et al., "Electron and Hole Mobility Enhancement in Strained-Si MOSFET's on SiGe-on-Insulator Substrates Fabricated by SIMOX Technology," *IEEE Electron Device Letters*, vol. 21, No. 5 (May 2000) pp. 230-232.

Rim et al., "Fabrication and Analysis of Deep Submicron Strained-Si N-MOSFET's," *IEEE Transactions on Electron Devices*, vol. 47, No. 7 (Jul. 2000) pp. 1406-1415.

Barradas et al., "RBS analysis of MBE-grown SI/Ge/(001) Si heterostructures with thin, high Ge content SiGe channels for HMOS transistors," *Modern Physics Letters B* (2001) (abstract).

Canaperi et al., "Preparation of a relaxed Si-Ge layer on an insulator in fabricating high-speed semiconductor devices with strained epitaxial films," *Intern. Business Machines Corporation*, USA (2002) (abstract).

Rim et al., "Enhanced Hole Mobilities in Surface-Channel Strained-Si p-MOSFETs," Solid State Electronics Laboratory, Stanford University, Stanford, CA 94305, pp. 20.3.1-20.3.4.

Meyerson et al., "Cooperative Growth Phenomena in Silicon/Germanium Low-Temperature Epitaxy," *Applied Physics Letters*, vol. 53. No. 25 (Dec. 19, 1988) pp. 2555-2557.

Garone et al., "Silicon vapor phase epitaxial growth catalysis by the presence of germane," *Applied Physics Letters*, vol. 56, No. 13 (Mar. 26, 1990) pp. 1275-1277.

Robbins et al., "A model for heterogeneous growth of $Si_{1-x}Ge_x$ films for hydrides," Journal of Applied Physics, vol. 69, No. 6 (Mar. 15, 1991) pp. 3729-3732.

Grützmacher et al., "Ge segregation in SiGe/Si heterostructures and its dependence on deposition technique and growth atmosphere," *Applied Physics Letters*, vol. 63, No. 18 (Nov. 1, 1993) pp. 2531-2533.

Cullis et al, "Growth ripples upon strained SiGe epitaxial layers on Si and misfit dislocation interactions," *Journal of Vacuum Science and Technology A*, vol. 12, No. 4 (Jul./Aug. 1994) pp. 1924-1931.

Tweet et al., "Factors determining the composition of strained GeSi layers grown with disilane and germane," *Applied Physics Letters*, vol. 65, No. 20 (Nov. 14, 1994) pp. 2579-2581.

Aigouy et al., "MOVPE Growth and optical characterization of ZnSe/ZnS strained layer superlattices," *Superlattices and Microstructures*, vol. 16, No. 1 (1994) pp. 71-76.

Kikkawa et al., "Effect of strained InGaAs step bunching on mobility and device performance in n-InGaP/InGaAs/GaAs pseudomorphic heterostructures grown by metalorganic vapor phase epitaxy," *Journal of Crystal Growth*, vol. 145 (1994) pp. 799-807.

Pelekanos et al ., "Interface roughness correlation in CdTe/CdZnTe strained quantum wells," *Journal of Crystal Growth*, vol. 184/185 (1998) pp. 886-889.

Eaglesham et al., "Dislocation-Free Stranski-Kratanow Growth of Ge on Si(100)," *Physical Review Letters*, vol. 64, No. 16 (Apr. 16, 1990) pp. 1943-1946.

Fitzgerald et al., "Totally relaxed $Ge_xSi_{1-x}$ layers with low threading dislocation densities grown on Si substrates," *Appl. Phys. Lett.*, vol. 59, No. 7 (Aug. 12, 1991) pp. 811-813.

Fitzgerald et al., "Relaxed $Ge_xSi_{1-x}$ structures for III-V integration with Si and high mobility two-dimensional electron gases in Si," *J. Vac. Sci. Technol. B*, vol. 10, No. 4 (Jul./Aug. 1992) pp. 1807-1819.

Xie et al., "Very high mobility two-dimensional hole gas in Si/ $Ge_xSi_{1-x}$/Ge structures grown by molecular beam epitaxy," *Appl. Phys. Lett.*, vol. 63, No. 16 (Oct. 18, 1993) pp. 2263-2264.

Wesler et al., "Electron Mobility Enhancement in Strained-Si N-Type Metal-Oxide-Semiconductor Field-Effect Transistors," *IEEE Electron Device Letters*, vol. 15, No. 3 (Mar. 1994) pp. 100-102.

Ismail et al., "Modulation-doped n-type Si/SiGe with inverted interface," *Appl. Phys. Lett.*, vol. 65, No. 10 (Sep. 5, 1994) pp. 1248-1250.

Xie et al., "Semiconductor Surface Roughness: Dependence on Sign and Magnitude of Bulk Strain," *The Physical Review Letters*, vol. 73, No. 22 (Nov. 28, 1994) pp. 3006-3009.

Bouillon et al., "Search for the optimal channel architecture for 0.18/0.12 μm bulk CMOS Experimental study," *IEEE*, (1996) pp. 21.2.1-21.2.4.

Kearney et al., "The effect of alloy scattering on the mobility of holes in a $Si_{1-x}Ge_x$ quantum well," *Semicond. Sci Technol.*, vol. 13 (1998) pp. 174-180.

Höck et al., "High performance 0.25 μm p-type Ge/SiGe MODFETs," *Electronics Letters*, vol. 34, No. 19 (Sep. 17, 1998) pp. 1888-1889.

Bufler et al., "Hole transport in strained $Si_{1-x}Ge_x$ alloys on $Si_{1-y}Ge_y$ substrates," *Journal of Applied Physics*, vol. 84, No. 10 (Nov. 15, 1998) pp. 5597-5602.

Fitzgerald et al., "Dislocation dynamics in relaxed graded composition semiconductors," *Materials Science and Engineering B67*, (1999) pp. 53-61.

Fischetti, "Long-range Coulomb interactions in small Si devices. Part II. Effective electronmobility in thin-oxide structures," *Journal of Applied Physics*, vol. 89, No. 2 (Jan. 15, 2001) pp. 1232-1250.

Cheng et al., "Electron Mobility Enhancement in Strained-Si n-MOSFETs Fabricated on SiGe-on-Insulator (SGOI) Substrates," *IEEE Electron Device Letters*, vol. 22, No. 7 (Jul. 2001) pp. 321-323.

Leitz et al., "Dislocation glide and blocking kinetics in compositionally graded SiGe/Si," *Journal of Applied Physics*, vol. 90, No. 6 (Sep. 15, 2001) pp. 2730-2736.

Currie et al., "Carrier mobilities and process stability of strained S in- and p-MOSFETs on SiGe virtual substrates," *J. Vac. Sci. Technol. B.*, vol. 19, No. 6 (Nov./Dec. 2001) pp. 2268-2279.

Ransom et al., "Gate-Self-Aligned n-channel and p-channel Germanium MOSFET's," *IEEE Transactions on Electron Devices*, vol. 38, No. 12 (Dec. 1991) pp. 2695.

König et al., "p-Type Ge-Channel MODFET's with High Transconductance Grown on Si Substrates," *IEEE Electron Device Letters*, vol. 14, No. 4 (Apr. 1993) pp. 205-207.

Fischetti et al., "Band structure, deformation potentials, and carrier mobility in strained Si, Ge, and SiGe alloys," *J. Appl. Phys.*, vol. 80, No. 4 (Aug. 15, 1996) pp. 2234-2252.

Currie et al., "Controlling threading dislocation densities in Ge on Si using graded SiGe layers and chemical-mechanical polishing," *Applied Physics Letters*, vol. 72, No. 14 (Apr. 6, 1998) pp. 1718-1720.

Reinking et al., "Fabrication of high-mobility Ge p-channel MOSFETs on Si substrates,"*Electronics Letters*, vol. 35, No. 6 (Mar. 18, 1999) pp. 503-504.

Koester et al., "Extremely High Transconductance $Ge/Si_{0.4}Ge_{0.6}$ p-MODFET's Grown by UHV-CVD," *IEEE Electron Device Letters*, vol. 21, No. 3 (Mar. 2000) pp. 110-112.

Carlin et al., "High Efficiency GaAs-on-Si Solar Cells with High $V_\infty$ Using Graded GeSi Buffers," *IEEE* (2000) pp. 1006-1011.

Srolovitz, "On the Stability of Surfaces of Stressed Solids," *Acta metall.*, vol. 37, No. 2 (1989) pp. 621-625.

Cullis et al, "The characteristics of strain-modulated surface undulations formed upon epitaxial $Si_{1-x}Ge_x$ alloy layers on Si," *Journal of Crystal Growth*, vol. 123 (1992) pp. 333-343.

Reinking et al., "Fabrication of High-Mobility Ge p-Channel MOSFETs on Si Substrates," *Electronics Letters*, vol. 35, No. 6 (Mar. 18, 1999) pp. 503-504.

Rosenblad et al., "Virtual Substrates for the n- and p-type Si-MODFET Grown at Very High Rates," *Materials Science and Engineering*, vol. B74 (2000) pp. 113-117.

Ueno et al., "Low Temperature Buffer Growth for Modulation Doped SiGe/Ge/SiGe Heterostructures with High Hole Mobility," *Thin Solid Films*, vol. 369 (2000) pp. 320-323.

Yousif et al., "Recent Critical Issues in $Si/Si_{1-x}Ge_x/Si$ Heterostructure FET Devices," *Solid-State Electronics*, vol. 45, No. 11 (2001) pp. 1931-1937.

Anonymous, "Germanium P-Channel Mosfet," *IBM Technical Disclosure Bulletin*, vol. 28, No. 2 (Jul. 1, 1985) p. 500.

International Search Report of PCT/US03/17275, dated Oct. 14, 2003.

Bedair, "Atomic layer epitaxy deposition processes," J. Vac. Sci. Technol. B, 12(1):179-185 (1994).

Ghandhi, VLSI Fabrication Principle Silicon and Gallium Arsenide, 2nd Ed., John Wiley & Sons, Inc., New York, pp. 258-261, 518-522 (1994).

International Search Report for PCT/US-02/19384, dated Nov. 11, 2002.

International Search Report for PCT/US03/181123, dated Dec. 1, 2003.

Meyerson, "UHV/CVD Growth of Si and Si:Ge Alloys: Chemistry, Physics, and Device Applications," Proceedings of the IEEE, 80(10):1592-1608 (1992).

U.S. Appl. No. 09/884,517, filed Jun. 19, 2001, by Fitzgerald et al.
U.S. Appl. No. 09/884,172, filed Jun. 19, 2001, by Fitzgerald et al.
U.S. Appl. No. 09/906,551, filed Jul. 16, 2001, by Fitzgerald.
U.S. Appl. No. 09/906,545, filed Jul. 16, 2001, by Fitzgerald.
U.S. Appl. No. 09/906,200, filed Jul. 16, 2001, by Fitzgerald.
U.S. Appl. No. 09/906,201, filed Jul. 16, 2001, by Fitzgerald.
U.S. Appl. No. 09/906,438, filed Jul. 16, 2001, by Fitzgerald.
U.S. Appl. No. 10/005,274, filed Dec. 4, 2001, by Fitzgerald et al.

\* cited by examiner

DUAL-CHANNEL CMOS TRANSISTORS WITH DIFFERENTIALLY STRAINED CHANNELS

RELATED APPLICATION

This application claims the benefit of U.S. Provisional Patent Application Ser. No. 60/311,188, filed on Aug. 9, 2001, the entire contents of which are incorporated herein by reference.

FIELD OF THE INVENTION

The present invention relates generally to semiconductor structures and particularly to semiconductor structures formed on strained semiconductor layers.

BACKGROUND

The recent development of silicon (Si) substrates with strained layers has increased the options available for design and fabrication of field-effect transistors (FETs). Enhanced performance of n-type metal-oxide-semiconductor (NMOS) transistors has been demonstrated with heterojunction metal-oxide-semiconductor field effect transistors (MOS-FETs) built on substrates having strained silicon and relaxed silicon-germanium (SiGe) layers. Tensilely-strained silicon greatly enhances electron mobilities. NMOS devices with strained silicon surface channels, therefore, have improved performance with higher switching speeds. Hole mobilities are enhanced in tensilely-strained silicon as well, but to a lesser extent for strain levels less than approximately 1.5%. Equivalent enhancement of p-type metal-oxide-semiconductor (PMOS) device performance, therefore, in such surface-channel devices presents a challenge.

A structure that incorporates a compressively strained SiGe layer in tandem with a tensilely strained Si layer can provide greatly enhanced electron and hole mobilities. In this structure, electron transport typically occurs within a surface tensilely strained Si channel and hole transport occurs within the compressively strained SiGe layer below the Si layer. To support the fabrication of NMOS transistors as well as PMOS transistors on this structure, the surface tensilely strained Si layer has a typical thickness of 50–200 Ångstroms (Å) for providing a channel for conduction of electrons. If this layer is thinner than 50 Å, the beneficial mobility enhancement is significantly reduced because the electrons are no longer completely confined within the strained Si layer. Although some NMOS devices are operational with a strained silicon surface channel of only 50 Å, even this strained silicon layer thickness may be too thick to allow modulation of p-type carriers in a buried SiGe layer by an operating voltage applied to the gate of a PMOS transistor.

Complementary metal-oxide silicon (CMOS) circuit design is simplified if carrier mobilities are enhanced equally for both NMOS and PMOS devices. In conventional silicon-based devices, electron mobilities are approximately two times greater than hole mobilities. As noted, electron mobilities have been substantially increased with strained silicon. Methods for equally increasing hole and electron mobilities by forming dual-channel NMOS and PMOS devices on the same substrate are problematic, in part because of different surface strained-silicon thickness requirements for the two types of devices.

SUMMARY

In a dual-channel CMOS structure, electron transport takes place in a surface channel, e.g., a strained silicon layer with a thickness greater than 5 nanometers (nm). Hole transport occurs either in a buried channel, such as a buried compressed SiGe channel, or in both the strained silicon surface layer and the buried compressed SiGe layer. Hole mobility in this type of structure is improved because of a reduction in hole scattering due to sub-band splitting, and because of a reduction in hole effective mass, both of which are associated with transport in strained SiGe and strained Si.

In a MOSFET, having carriers such as holes close to the gate improves switching speeds. A thinned strained silicon layer above a PMOS channel facilitates control of hole transport by a voltage applied to a gate above the PMOS channel. If the strained silicon layer over the PMOS channel is too thick, the majority of carriers will be pulled closer to the surface from the buried channel. This configuration will result in a lack of device performance enhancement by the buried channel. Selectively thinning the strained silicon layer above a PMOS channel while maintaining a greater strained silicon thickness as an NMOS channel enables better control of hole transport in p-channel devices while simultaneously providing an adequate channel for electron transport in n-channel devices.

In an aspect, the invention features a semiconductor structure having a surface layer having strained silicon disposed over a substrate, the surface layer including a first region having a first thickness and a second region having a second thickness, the first thickness being less than the second thickness. The structure also includes a gate dielectric disposed over a portion of at least the first region of the surface layer.

One or more of the following features may also be included. The gate dielectric layer may be disposed over a portion of the second region of the surface layer. The gate dielectric layer thickness may be approximately 10–100 Å. The first thickness may be approximately 7–20 Å.

In another aspect, the invention features a semiconductor structure having a surface layer with strained silicon disposed over a substrate. A portion of the surface layer has a minimum thickness necessary for growing a silicon dioxide layer having satisfactory integrity.

One or more of the following features may also be included. The minimum surface layer thickness may be approximately 10–20 Å. The surface layer may be disposed over the underlying layer and the underlying layer may induce strain in the surface layer. The underlying layer may include germanium and/or silicon. The underlying layer may be disposed over an insulator layer.

In yet another aspect, a surface layer including strained silicon is disposed over a substrate, the surface layer including a first region having a first thickness and a second region having a second thickness, the first thickness being less than the second thickness. The first region has a first source and a first drain, with the first source and the first drain including a first type of dopant. The second region has a second source and a second drain, with the second source and the second drain including a second type of dopant.

One or more of the following features may also be included. The surface layer may include tensilely strained silicon. The first type of dopant may be p-type and the second type of dopant may be n-type. The substrate may include a region under compressive strain sharing an interface with the surface layer, the tensilely strained surface layer enhancing mobility of electrons and the compressively strained substrate region enhancing mobility of holes. A gate may be disposed above the surface layer, with the first thickness being sufficiently small such that application of an operating voltage to the gate modulates movement of charge carriers within the compressively strained substrate region, and a majority of the charge carriers populate the compressively strained substrate region. An insulator may be provided between the gate and the surface layer. The compressively strained substrate region may include silicon and/or germanium.

In another aspect, the invention features a method for forming a semiconductor structure. The method includes providing a substrate having a surface layer disposed thereon, the surface layer including strained silicon. A sacrificial layer is selectively formed in a portion of the surface layer. The sacrificial layer is selectively removed to define a first region of the surface layer having a first thickness proximate a second region of the surface layer having a second thickness, with the first thickness being less than the second thickness.

One or more of the following features may also be included. Prior to forming the sacrificial layer, a masking layer may be formed over the surface layer, and a portion of the masking layer removed to expose the portion of the surface layer. The sacrificial layer may subsequently be selectively formed in the portion of the surface layer exposed by the masking layer. Forming the masking layer may include forming a masking silicon nitride layer. Forming the masking layer may also include forming a pad silicon dioxide layer prior to forming the masking silicon nitride layer. A first source and a first drain may be formed in the first region of the surface layer, the first source and the first drain including a first type of dopant. A second source and a second drain may be formed in the second region of the surface layer, the second source and the second drain including a second type of dopant. The first type of dopant may be n-type and the second type of dopant may be p-type. The surface layer may be disposed over a relaxed layer. The relaxed layer may comprise germanium and/or silicon.

Like referenced features identify common features in corresponding drawings.

DETAILED DESCRIPTION

Figure 1:
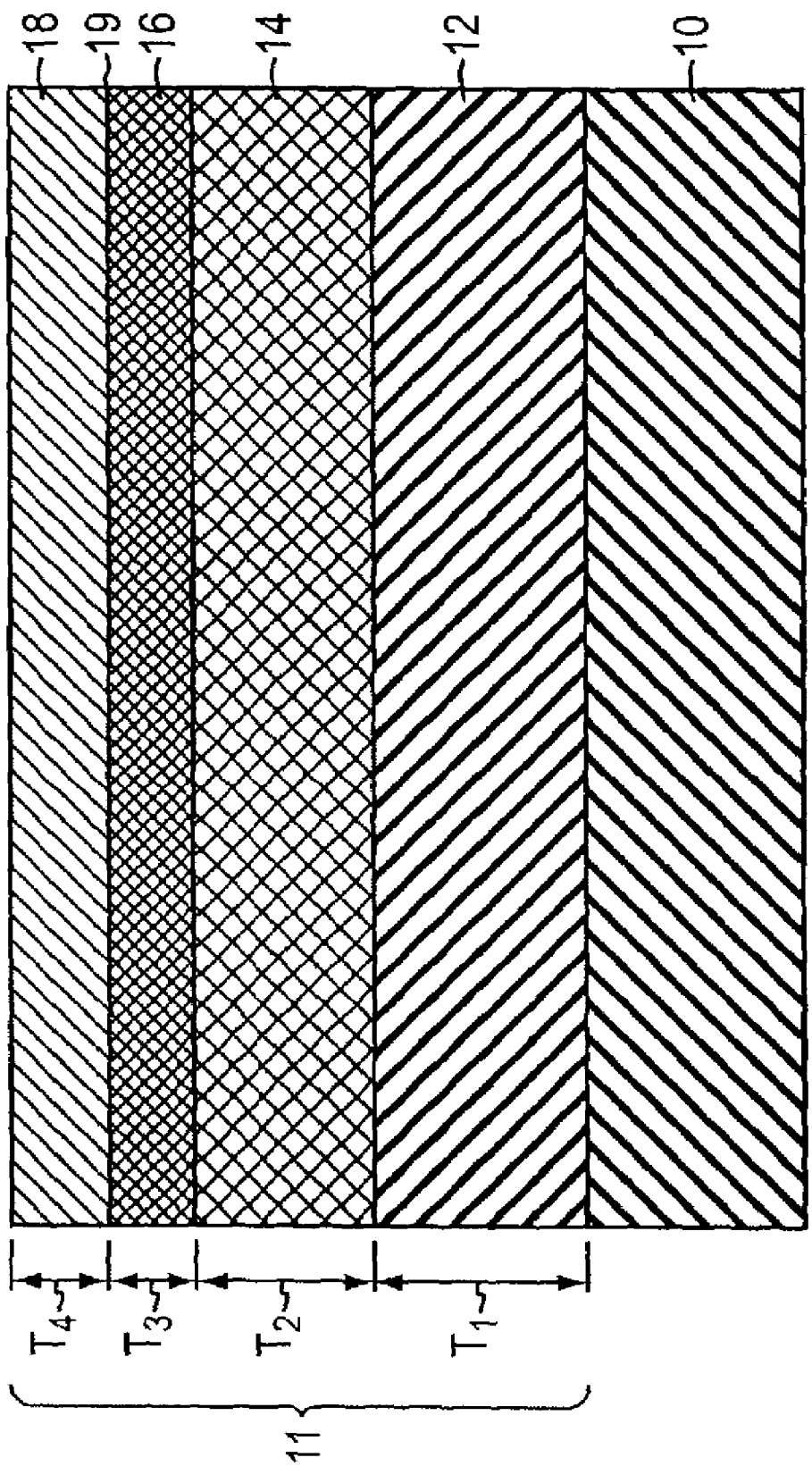
FIGS. 1–8 are a series of schematic cross-sectional views of a semiconductor substrate illustrating a process for fabricating a semiconductor structure on the substrate.

Referring to FIG. 1, which illustrates a structure amenable to use with the present invention, a substrate 10 is made of a semiconductor, such as silicon. Several layers collectively indicated at 11 are formed on substrate 10. In particular, a graded SiGe layer 12 is disposed over substrate 10. Graded SiGe layer 12 has a grading rate of, for example, 10% Ge per micron of thickness, and a thickness $T_1$ of, for example, 2–5 microns. A relaxed SiGe layer 14 is disposed over graded SiGe layer 12. Relaxed SiGe layer 14 contains, for example, 20–50% Ge and has a thickness $T_2$ of, e.g., 0.2–2 microns. A compressed SiGe layer 16, under compressive strain, is disposed over relaxed SiGe layer 14. Compressed SiGe layer 16 has a Ge content higher than the Ge content of relaxed SiGe layer 14. Compressed SiGe layer 16 contains, for example, 40–100% Ge and has a thickness $T_3$ of, e.g., 10–200 Ångstroms (Å). In an embodiment, compressed SiGe layer 16 thickness $T_3$ is approximately 100 Å. A tensilely strained silicon surface layer 18 is disposed over compressed SiGe layer 16, sharing an interface 19 with compressed SiGe layer 16. Strained silicon surface layer 18 has a starting thickness $T_4$ of, for example, 50–300 Å. In an embodiment, starting thickness $T_4$ is approximately 200 Å. A suitable substrate 10 with layers 11 can be readily obtained from, e.g., IQE Silicon Compounds, Ltd., UK.

Figure 2:
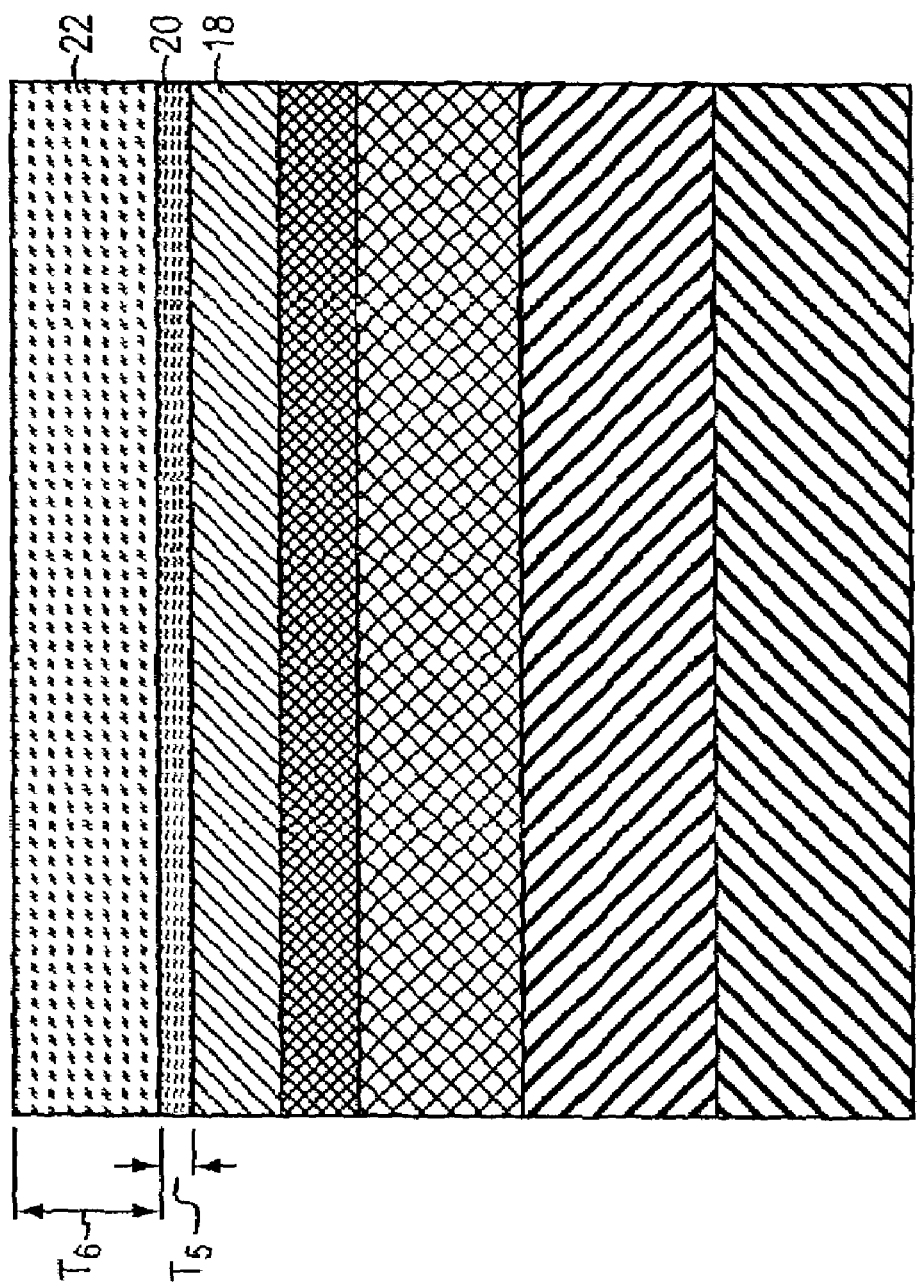

Referring to FIG. 2, a first masking layer 20, such as a pad silicon dioxide layer, hereinafter referred to as pad oxide 20, is deposited over strained silicon surface layer 18 by a deposition method such as low-pressure chemical vapor deposition (LPCVD). Pad oxide 20 has a thickness $T_5$ of, e.g., 100 Å. Subsequently, a second masking layer 22, such as a masking silicon nitride layer, hereinafter referred to as masking nitride 22, is deposited over pad oxide 20 by a deposition method such as plasma enhanced chemical vapor deposition (PECVD). Masking nitride 22 has a thickness $T_6$ of, for example, 500–1000 Å.

Figure 3:
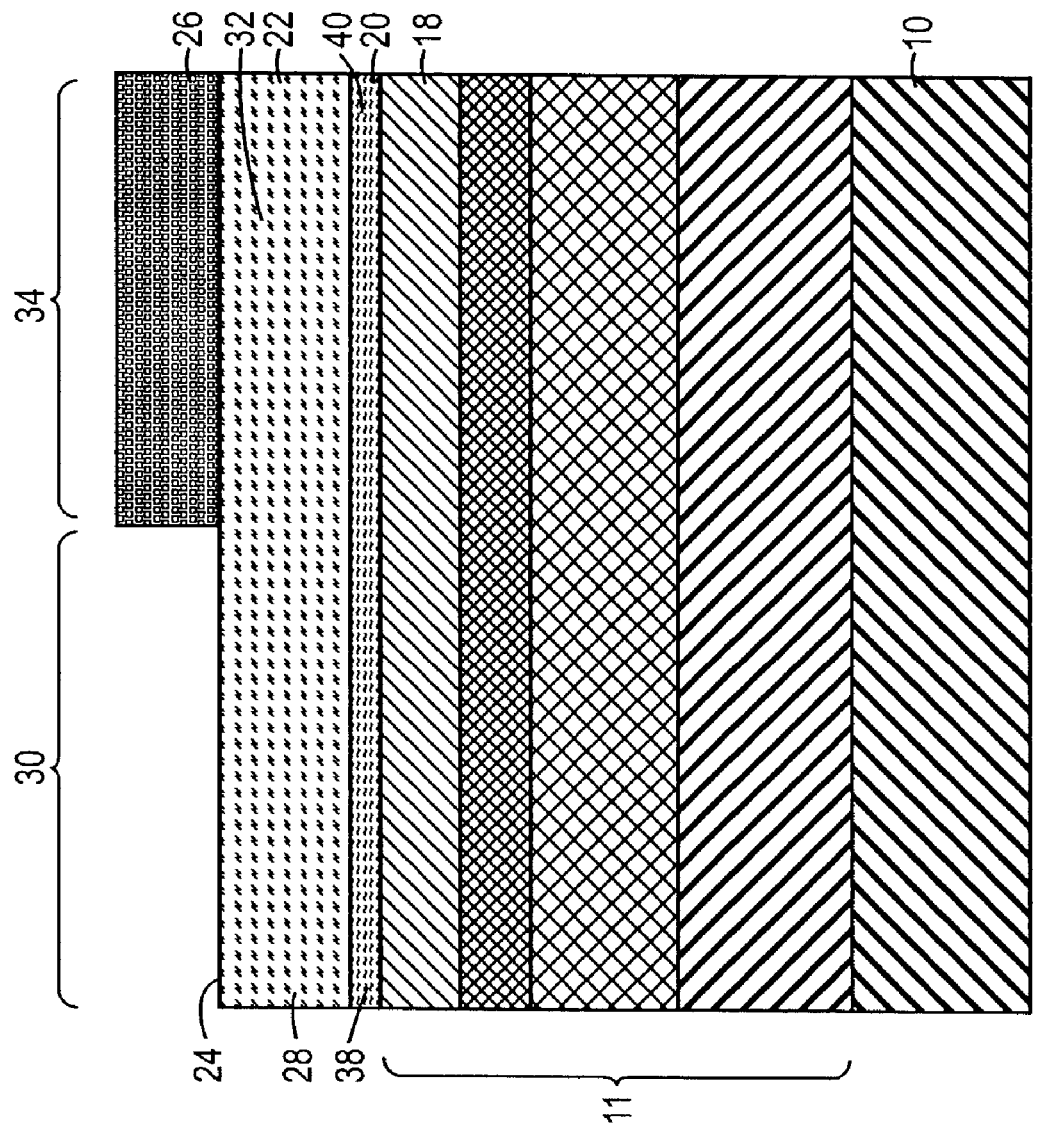

Referring to FIG. 3, a photoresist layer is deposited over a top surface 24 of masking nitride 22 and patterned to form a photoresist mask 26. Photoresist mask 26 exposes top surface 24 of a first portion 28 of masking nitride 22 disposed over a first region 30 of substrate 10 and layers 11. A device such as a PMOS transistor will be formed in first region 30 with subsequent processing (see, e.g., PMOS transistor 59 in FIG. 8). Photoresist mask 26 covers top surface 24 of a second portion 32 of masking nitride 22 disposed over a second region 34 of substrate 10 and layers 11, including strained silicon surface layer 18. A device, such as an NMOS transistor, will be formed in second region 34 with subsequent processing (see, e.g., NMOS transistor 64 in FIG. 8).

Figure 4:
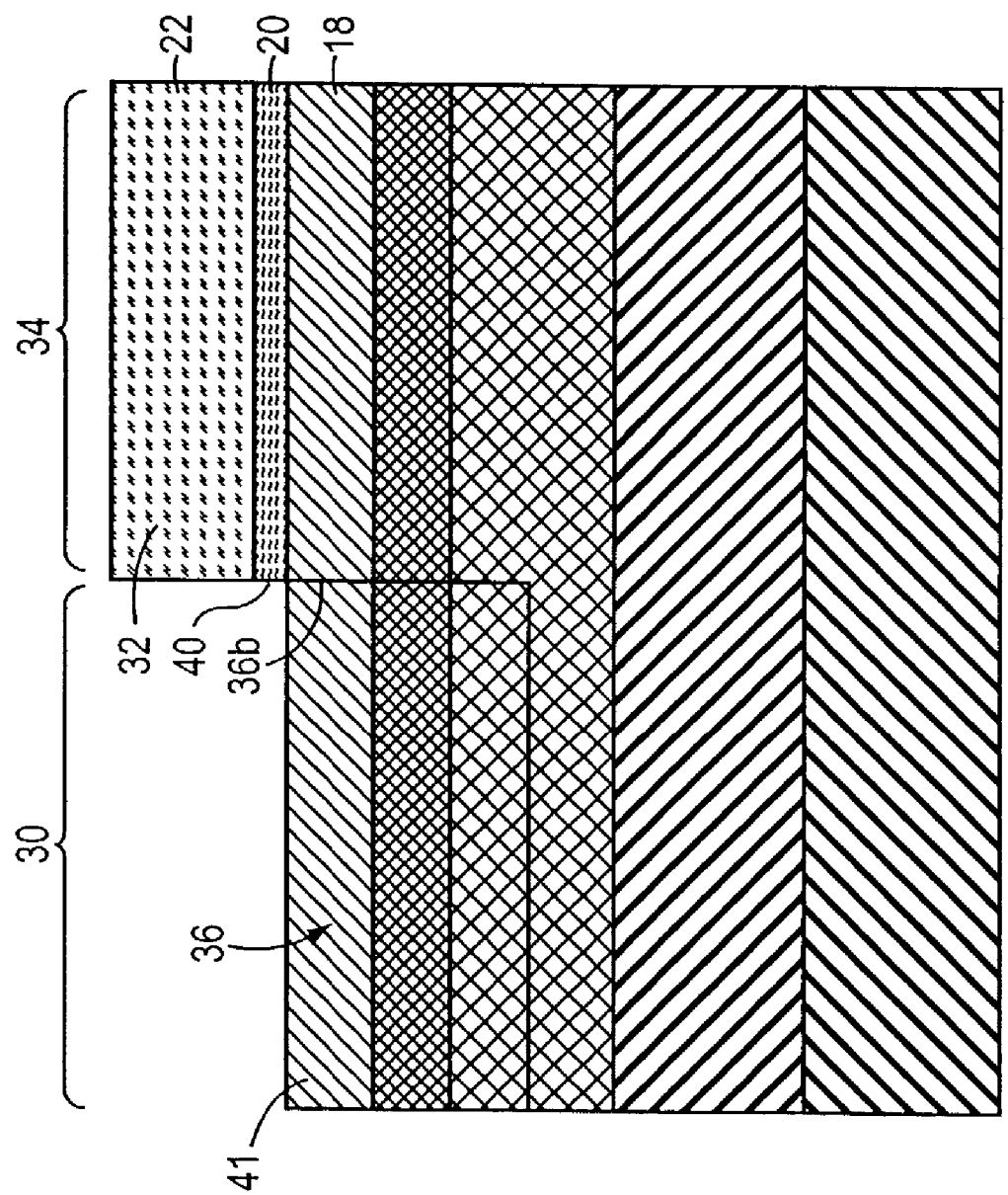

Referring to FIG. 3 and also to FIG. 4, first masking nitride portion 28 and a first portion 38 of pad oxide 20 underneath first masking nitride portion 28 are both removed, leaving behind second masking nitride portion 32 and a second portion 40 of pad oxide 20 that are protected by photoresist mask 26. Specifically, exposed first masking nitride portion 28 may be removed by a removal process such as a reactive ion etch (RIE) using gases such as a combination of nitrogen trifluoride, ammonia, and oxygen, or a combination of hydrogen bromide, chlorine, and oxygen. First pad oxide portion 38 may be removed by a wet etch that is selective to silicon, such as a hydrofluoric acid etch. The removal of pad oxide portion 38 exposes a portion 41 of strained silicon surface layer 18. Ions are introduced into areas not covered by photoresist mask 26, including first region 30, to form a well 36, defined, for purposes of illustration, by the boundary 36b. For example, n-type ions, such as phosphorus, are implanted to form well 36 for a PMOS transistor. The dosage and energy of the phosphorus ion implantation is, for example, 400 keV with $1.5 \times 10^{13}$ atoms/cm$^2$. After the selective removal of first portions 28, 38 of masking nitride 22 and pad oxide 20 and the formation of well 36, photoresist mask 26 is removed by a stripping process such as a dry strip in an oxygen plasma.

Figure 5:
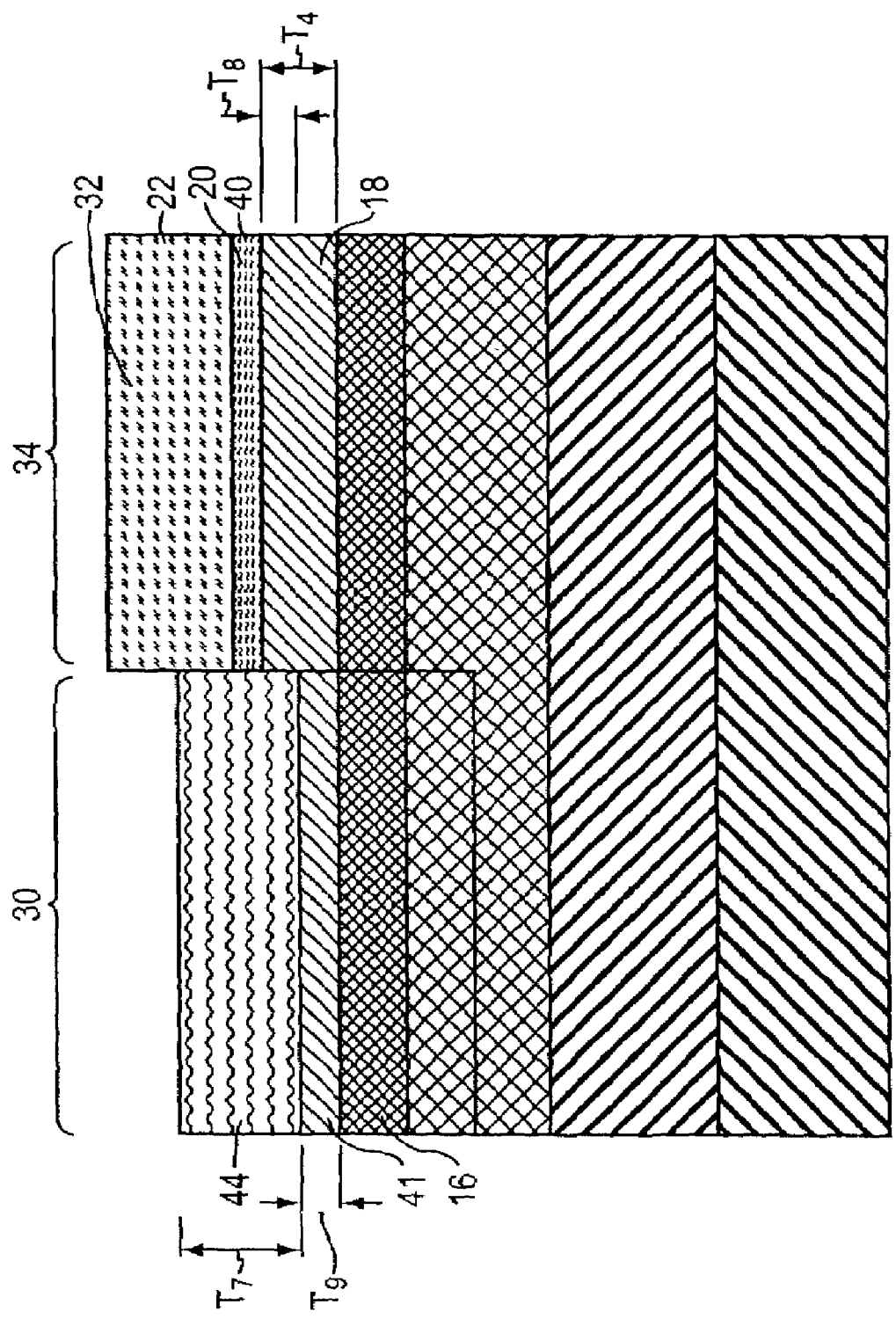

Referring to FIG. 5, a sacrificial layer 44 is formed on portion 41 of strained silicon surface layer 18. Sacrificial layer 44 is, for example, silicon dioxide grown by thermal oxidation. Thermal oxidation parameters may include, for example, an oxygen ambient at atmospheric pressure at 900° C. for 30 minutes. In an alternative embodiment, sacrificial layer 44 is silicon dioxide grown using a mixture of oxygen and hydrogen. During formation of sacrificial layer 44, this layer consumes a part of the thickness of portion 41 of strained silicon surface layer 18 in region 30. In an embodiment in which sacrificial layer 44 is silicon dioxide, sacrificial layer 44 typically builds up to a thickness $T_7$ of slightly more than twice a thickness $T_8$ of strained silicon surface layer 18 that is removed in region 30 by the growth of sacrificial layer 44. For example, if strained silicon surface layer 18 has a starting thickness $T_4$ of 200 Å, and thinned first region 41 of strained silicon surface layer 18 with an initial thickness $T_9$ of, for example, 20 Å, is desired in first region 30, a thickness $T_8$ of 180 Å of strained silicon surface layer 18 needs to be removed in first region 30. This strained silicon thickness $T_8$ can be consumed by growing sacrificial layer 44 having thickness $T_7$ of approximately 400 Å.

Figure 6:
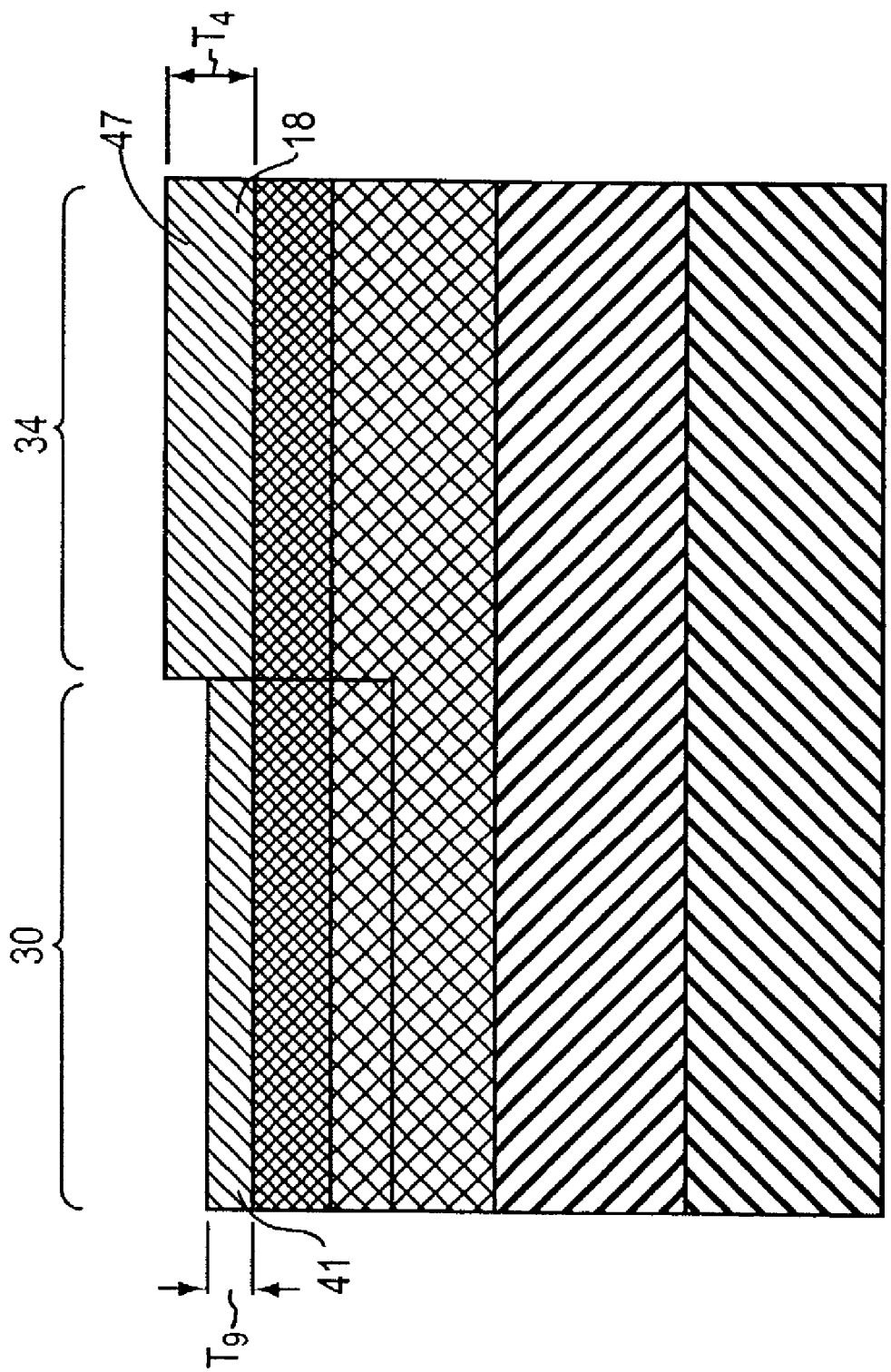
Figure 7:
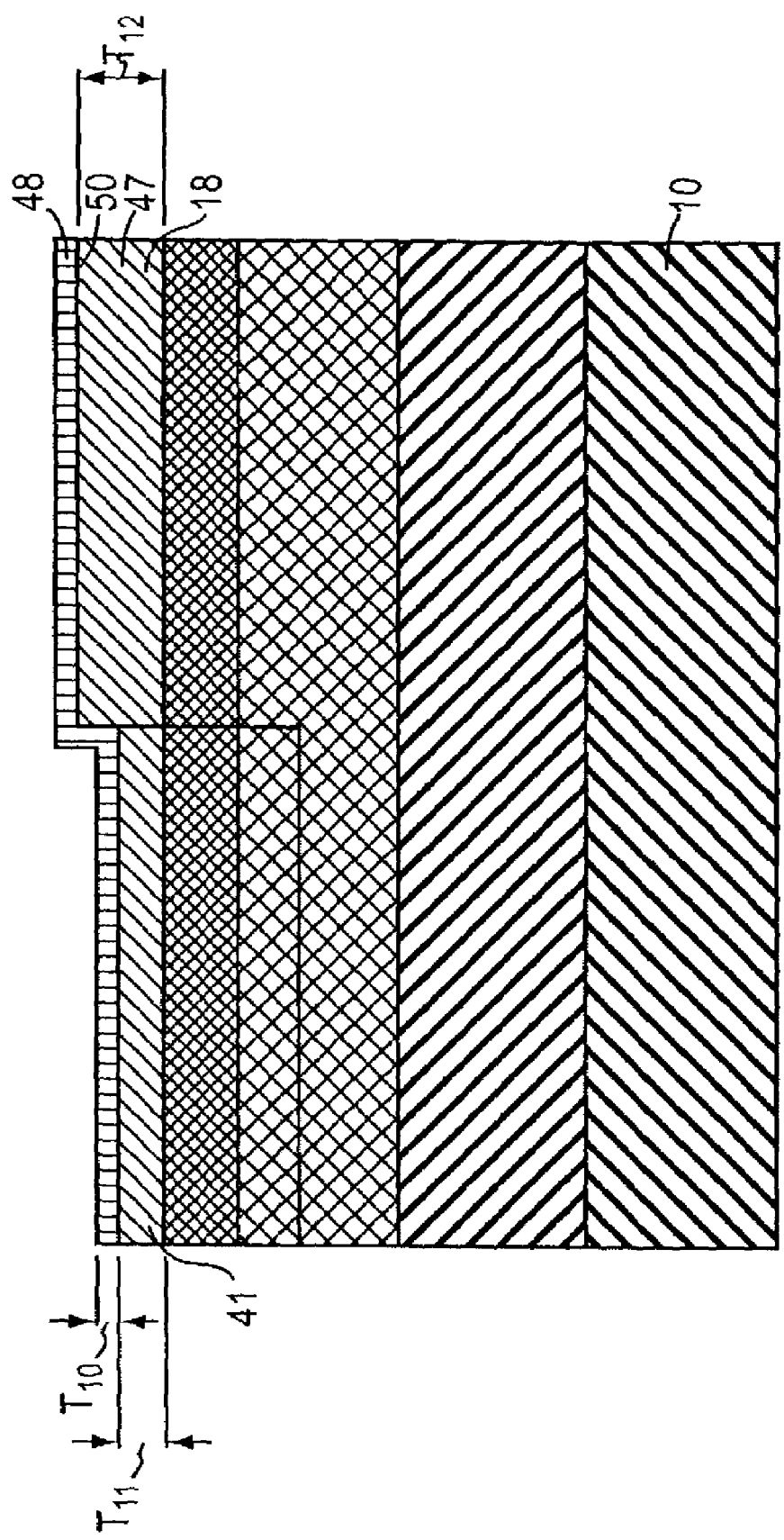

Referring to FIG. 5 and also to FIG. 6, portion 32 of masking nitride layer 22 in region 34 is removed by, for example, an RIE process. Subsequently, portion 40 of pad oxide 20 and substantially all of sacrificial layer 44 are removed with an oxide etch selective to silicon, such as a hydrofluoric acid etch. The removal of sacrificial layer 44 exposes thinned first region 41 of strained silicon surface layer 18 with initial thickness $T_9$ disposed over first substrate region 30. Thinned strained silicon surface layer first region 41 is proximate a second (unthinned) region 47 of strained silicon surface layer 18 in second substrate region 34. Initial thickness $T_9$ of thinned surface layer first region 41 is less than starting thickness $T_4$ of surface layer second region 47, which remains substantially unmodified. Initial thickness $T_9$ is selected to be relatively thin so as to, in a PMOS transistor, facilitate control by a gate voltage of hole transport in SiGe layer 16 and possibly in strained silicon surface layer 18 (see, e.g., PMOS transistor 59 in FIG. 8). Referring still to FIGS. 5 and 6 and also to FIG. 7, initial thickness $T_9$ of strained silicon surface layer 18 also has a minimum limit. Strained silicon surface layer 18, including both thinned first region 41 and unthinned second region 47, must be thick enough to enable subsequent growth of a gate dielectric 48, such as a gate oxide, having satisfactory integrity. For purposes hereof, a gate oxide with satisfactory integrity is one that has, for example, a relatively low interface state density, e.g., less than $1 \times 10^{11}$ eV$^{-1}$cm$^{-2}$, and/or a relatively low leakage current, e.g., <10 nanoamperes/square micrometer (nA/μm$^2$) to 1 microampere/square micron (μA/μm$^2$) or even 10 μA/μm$^2$, preferably approximately 10–100 nA/μm$^2$ at 100° C. In some preferred embodiments, the leakage current may range from approximately 10–100 nA/μm$^2$. Thermal oxidation of SiGe or deposition of oxide films on SiGe results in high interface state density (>1× 10$^{11}$–1×10$^{12}$ eV$^{-1}$cm$^{-2}$). High interface state density at the semiconductor-insulator interface leads to undesirable shifts in threshold voltage and in extreme cases unacceptably large subthreshold slope. It is preferable, therefore, to grow gate oxide layers on silicon, rather than on SiGe. A thin gate oxide layer with satisfactory integrity can be grown on strained silicon surface layer 18 having a thickness $T_9$ of approximately 10–20 Å. In an embodiment, strained silicon surface layer 18 thickness $T_9$ is approximately 15 Å. Gate oxide, when grown on silicon, consumes a silicon thickness equal to approximately one-half of the thickness of the gate oxide grown. Leaving a margin for error, initial thickness $T_9$ of thinned strained silicon surface layer 41 can therefore be approximately 15 Å when the desired gate dielectric thickness is approximately 15 Å. Alternatively, $T_9$ can be selected as the final desired thickness, and gate dielectric layer 48 can be deposited rather than grown.

A gate dielectric layer 48 is formed on a top surface 50 of strained silicon surface layer 18. Gate dielectric layer 48 is, for example, a gate oxide with satisfactory integrity having a thickness $T_{10}$ of approximately 10–100 Å. In an embodiment, gate dielectric layer 48 thickness $T_{10}$ is approximately 15 Å. If the initial thickness $T_9$ of thinned strained silicon surface layer first region 41 is 15 Å after removal of sacrificial layer 44 (see FIGS. 5 and 6), thinned strained silicon surface layer 41 has a lower final thickness $T_{11}$ after growth of dielectric layer 48; once again, an oxide layer grown on strained silicon surface layer 18 typically builds up to a thickness of slightly more than twice a thickness of strained silicon surface layer 18 that is removed in region 30 by the growth of the oxide layer. Thinned strained silicon surface layer first region 41 final thickness $T_{11}$ is, for example, less than 10 Å when gate dielectric layer 48 has a thickness $T_{10}$ of approximately 15 Å and thinned strained silicon surface layer first region 41 initial thickness $T_9$ is 15 Å. Second strained silicon surface layer region 47 is also thinner after gate dielectric layer 48 growth. If strained silicon surface layer region 47 initial thickness $T_4$ is 200 Å (see FIG. 1), after growth of gate dielectric layer 48 with thickness $T_{10}$ of, e.g., 15 Å, strained silicon surface layer region 47 final thickness $T_{12}$ is approximately 192 Å.

Figure 8:
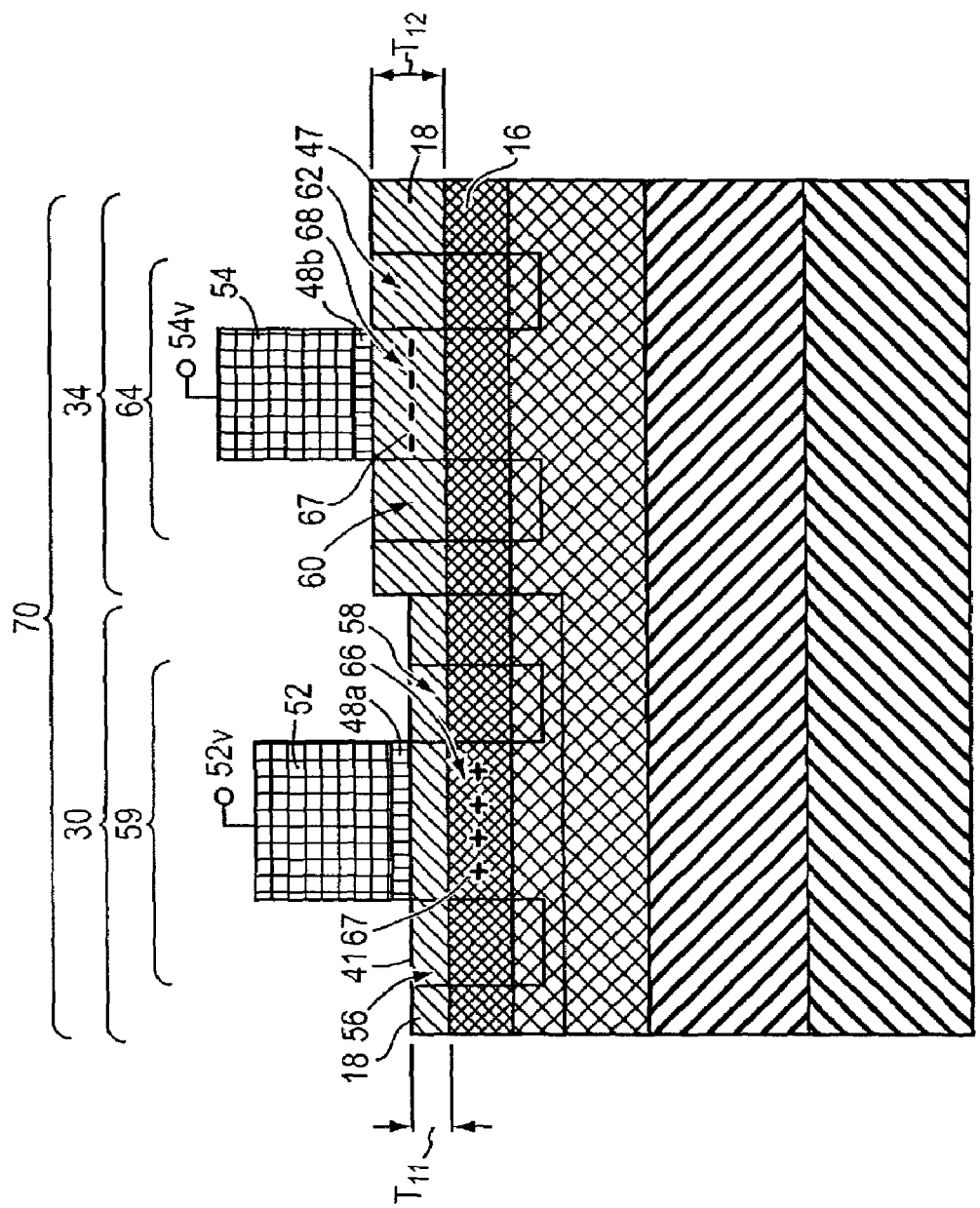

Referring to FIG. 8, a conducting layer, such as doped polysilicon, is deposited over gate dielectric layer 48. The conducting layer is patterned by, for example, photolithography and etching, to define a first gate 52 in first region 30 and a second gate 54 in second region 34. First gate 52 is, for example, a gate for a PMOS transistor 59 and second gate 54 is, for example, a gate for an NMOS transistor 64. A first source 56 and a first drain 58 (defined for purposes of illustration, by the interior boundaries) are formed in first region 30, proximate first gate 52. First source 56 and first drain 58 can be formed by the implantation of p-type ions, such as boron. PMOS transistor 59 includes first source 56, first drain 58, first gate 52 and a first dielectric layer portion 48a. A second source 60 and a second drain 62 are formed in second region 34, proximate second gate 54. Second source 60 and second drain 62 can be formed by the implantation of n-type ions, such as phosphorus. NMOS transistor 64 includes second source 60, second drain 62, second gate 54, and a second dielectric layer portion 48b.

During operation of PMOS transistor 59, an operating voltage bias 52v is applied to first gate 52. The operating voltage 52v modulates the movement of charge carriers in PMOS transistor 59. More specifically, charge carriers 67, e.g., holes travel through a compressed channel 66 in compressed SiGe layer 16 from first source 56 to first drain 58. The compressive strain of compressed SiGe layer 16 enhances the mobility of holes. Final thickness $T_{11}$ of strained silicon surface layer first region 41 is sufficiently small so that the operating voltage 52v applied to first gate 52 can modulate the movement of charge carriers 67 within compressed SiGe layer 16, and without drawing a majority of the charge carriers into tensilely strained silicon surface layer first region 41 between first source 56 and first drain 58. The majority of carriers 67 remain in compressed channel 66 in compressed SiGe layer 16, thereby retaining the benefits of enhanced performance resulting from greater carrier mobilities.

During operation of NMOS transistor 64, an operating voltage 54v is applied to second gate 54. Charge carriers 67, e.g., electrons travel through a strained channel 68 in strained silicon surface layer second region 47 from second source 60 to second drain 62. The strain of surface layer 18 enhances the mobility of electrons, and final thickness $T_{12}$ of strained silicon surface layer second region 47 is sufficiently high to confine the electrons in channel 68.

A dual-channel CMOS device 70 includes PMOS transistor 59 and NMOS transistor 64. In PMOS transistor 58, thinner thickness $T_{11}$ of strained silicon surface layer first region 41 allows modulation of carriers 67, e.g., holes, in compressed channel 66 by bias 52v applied to first gate 52. In adjacent NMOS transistor 64, thicker thickness $T_{12}$ of strained silicon surface layer second region 47 provides an adequate volume for confinement of carriers 67, e.g. electrons, in strained channel 68.

Figure 9:
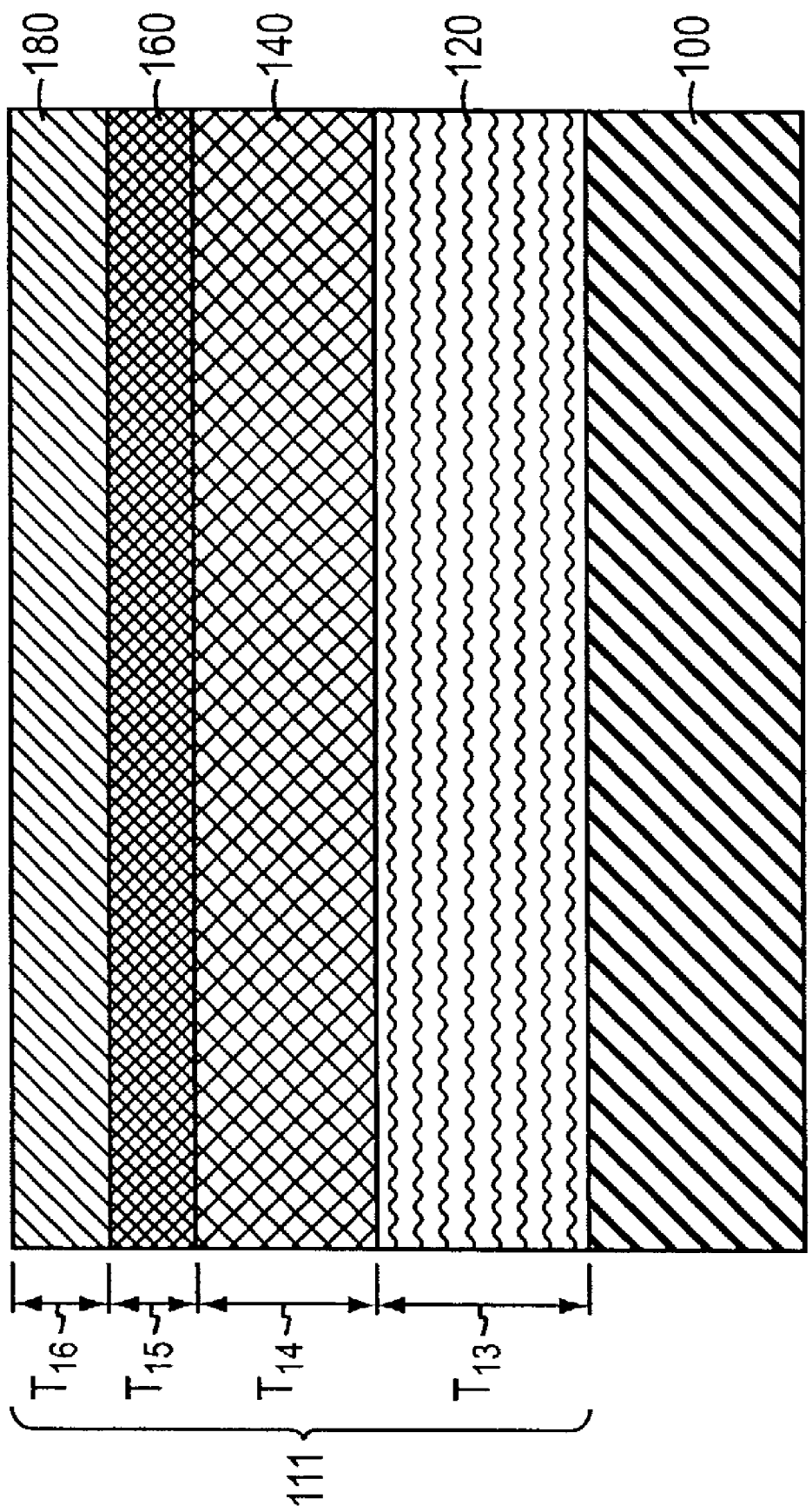
FIGS. 9–10 are schematic cross-sectional views of an alternative embodiment of a semiconductor structure fabricated on a substrate.

Referring to FIG. 9, in an embodiment, an alternative layer structure 111 is provided on a substrate 100. Substrate 100 is a semiconductor, such as silicon. An insulator layer 120 is disposed over substrate 100. Insulator layer 120 is made of an insulating material such as glass or silicon dioxide, and has a thickness $T_{13}$ of, e.g., 500–1500 Å. A relaxed SiGe layer 140 is disposed over insulator layer 120. Relaxed SiGe layer 140 contains, for example, 30% Ge and has a thickness $T_{14}$ of, e.g., 500 Å. A compressed SiGe layer 160 is disposed over relaxed SiGe layer 140. Compressed SiGe layer 160 contains, for example, 60% Ge and has a thickness $T_{15}$ within a range of, e.g., 20–200 Å. In an embodiment, compressed SiGe layer 160 thickness $T_{15}$ is 100 Å. A strained silicon surface layer 180 is disposed over compressed SiGe layer 160. Strained silicon surface layer 180 has a thickness $T_{16}$ within a range of, for example, 50–200 Å. In an embodiment, strained silicon surface layer 180 thickness $T_{16}$ is 150 Å. A suitable substrate 100 with layers 111, also called a SiGe-on-insulator (SGOI) substrate, can be produced using a combination of wafer bonding and ultrahigh vacuum chemical vapor deposition, as described, for example, by Cheng, et al., PCT Application Number PCT/US01/41680, International Publication Number WO 02/15244 A2, 2002, incorporated herein by reference, and Cheng et al., *Journal of Electronic Materials,* Vol. 30, No. 12, 2001, incorporated herein by reference. Relaxed SiGe layer 140 is optional. In an alternative embodiment, compressed SiGe layer 160 and strained silicon surface layer 180 can be provided directly onto insulator layer 120 by, e.g., wafer bonding.

Figure 10:
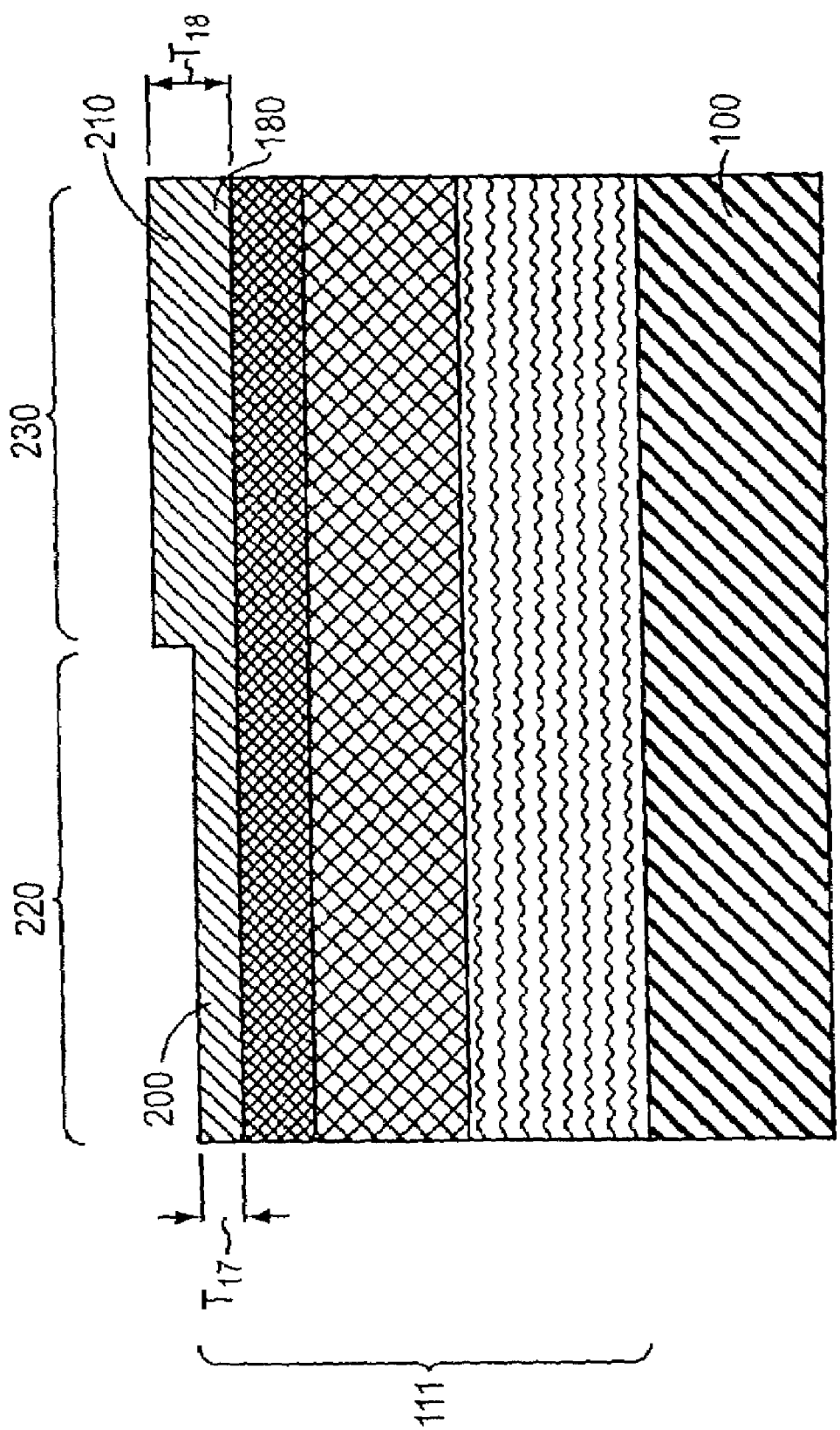

Referring to FIG. 10, strained silicon surface layer 180 is selectively thinned by, e.g., formation of a sacrificial oxide (not shown), as described above with reference to FIGS. 2–6. Strained silicon surface layer 180 has a first region 200 with a thickness $T_{17}$, that is less than a thickness $T_{18}$ of a second region 210 of strained silicon surface layer 180. Substrate 100 with layers 111 is subsequently processed, as described above with reference to FIGS. 7–8, to form, for example, a PMOS transistor (not shown) in first region 220 with thinned strained silicon surface layer 200 and an NMOS transistor (not shown) in second region 230.

While the invention has been particularly shown and described with reference to specific embodiments, it should be understood by those skilled in the art that various changes in form and detail may be made therein without departing from the spirit and scope of the invention as defined by the following claims. For example, the described semiconductor structures can be fabricated on a substrate without a graded SiGe layer. PMOS well formation can be performed either before or after patterning of pad oxide and masking nitride layers, either before or after the formation of the sacrificial oxide, and either before or after the removal of the sacrificial oxide. Masking nitride can be removed by a wet etch, such as by a heated phosphoric acid bath. Strained silicon layer can be selectively thinned by methods other than growth of a sacrificial oxide, such as by etching.

It is noted that various processing sequences such as cleaning steps can remove a thickness of exposed strained silicon. The final thickness of thinned strained silicon surface layer first region and the final thickness of strained silicon surface layer region may, therefore, be affected by these additional process steps. These steps can be taken into consideration when calculating appropriate initial and final strained silicon thicknesses to obtain desired final thicknesses after the gate dielectric layer is formed.

Gate dielectric can be a material that is deposited, e.g., a high-k dielectric. In this embodiment, the exposed strained silicon layer will not be consumed during the gate dielectric formation process.

An NMOS device can be formed in a region having a thinner strained silicon layer than the strained silicon layer thickness in a region where a PMOS device is formed. First source and first drain can be n-type, and second source and second drain can be p-type. PMOS and NMOS devices can be fabricated on various alternative substrates, using methods described above.

The invention may be embodied in other specific forms without departing from the spirit or essential characteristics thereof. The foregoing embodiments are therefore to be considered in all respects illustrative rather than limiting on the invention described herein. Scope of the invention is thus indicated by the appended claims rather than by the foregoing description, and all changes which come within the meaning and range of equivalency of the claims are intended to be embraced therein.

What is claimed is:

1. A semiconductor structure comprising:
    a surface layer comprising strained silicon disposed over a substrate, the surface layer including a first region having a non-zero first thickness and a second region having a second thickness, the first region having a bottom boundary co-planar with a bottom boundary of the second region and the first thickness being less than the second thickness;
    a first source and a first drain in the first region, the first source and the first drain including a first type of dopant; and
    a second source and a second drain in the second region, the second source and the second drain including a second type of dopant,
    wherein the substrate comprises a region under compressive strain sharing an interface with the surface layer, the strained surface layer enhancing mobility of electrons and the compressively strained substrate region enhancing mobility of holes.

2. The structure of claim 1 further comprising:
    an underlying relaxed layer.

3. The structure of claim 2, wherein the underlying relaxed layer comprises germanium.

4. The structure of claim 2, wherein the underlying relaxed layer comprises silicon.

5. The structure of claim 1 further comprising:
    an insulator layer,
    wherein the surface layer is disposed over the insulator layer.

6. The structure of claim 1, wherein the surface layer comprises tensilely strained silicon.

7. The structure of claim 1, wherein the first type of dopant is p-type and the second type of dopant is n-type.

8. The structure of claim 1, wherein the first type of dopant is n-type and the second type of dopant is p-type.

9. The structure of claim 1 further comprising:
a gate disposed above the surface layer, the first thickness being sufficiently small such that application of an operating voltage to the gate modulates movement of a plurality of charge carriers within the compressively strained substrate region and a majority of the carriers populate the compressively strained substrate region.

10. The structure of claim 9 further comprising:
an insulator between the gate and the surface layer.

11. The structure of claim 1, wherein the compressively strained substrate region comprises silicon.

12. The structure of claim 1, wherein the compressively strained substrate region comprises germanium.

13. The structure of claim 1, wherein the first thickness is greater than 7 Å.

14. The structure of claim 1, further comprising:
a gate dielectric disposed over a portion of at least the first region of the surface layer.

15. The structure of claim 14, wherein the gate dielectric layer comprises silicon dioxide.

16. The structure of claim 14, wherein the gate dielectric layer is disposed over a portion of the second region of the surface layer.

17. The structure of claim 14, wherein the gate dielectric layer has a thickness of approximately 10–100 Å.

18. The structure of claim 17, wherein the first thickness is approximately 7–20 Å.

19. The structure of claim 18, wherein the first thickness is less than 10 Å.

20. The structure of claim 17, wherein the gate dielectric layer has a thickness of approximately 15 Å.

21. The structure of claim 20, wherein the first thickness is less than 10Å.

* * * * *